United States Patent [19]

Cason, Jr.

[11] 3,908,153

[45] Sept. 23, 1975

[54] GROUND CLIP FOR SEMI-CONDUCTOR PACKAGE

[75] Inventor: George C. Cason, Jr., Phoenix, Ariz.

[73] Assignee: Ascon Corporation, Phoenix, Ariz.

[22] Filed: Aug. 22, 1974

[21] Appl. No.: 499,454

[52] U.S. Cl. .................... 317/2 R; 206/331; 339/19; 317/16

[51] Int. Cl.$^2$ .................... H05F 3/02

[58] Field of Search .................... 317/2 R, 16, 33 R; 206/328, 329, 331; 339/19, 39

[56] References Cited

UNITED STATES PATENTS

| | | | |
|---|---|---|---|
| 3,648,108 | 3/1972 | Bailey | 317/2 R |
| 3,653,498 | 4/1972 | Kisor | 317/2 R |
| 3,774,075 | 11/1973 | Medesha | 317/2 R |

*Primary Examiner*—James D. Trammell
*Attorney, Agent, or Firm*—William H. Drummond

[57] ABSTRACT

A clip is formed from an electrically conductive cover having integral inwardly biased skirt portions depending along either side thereof. When the chip is engaged over the base of a semi-conductor package the skirt portions electrically contact each of the several leaves depending from the base to maintain each of the leaves at the same electrical potential. Optionally the cover has an aperture therethrough to expose the area of the base which carries the integrated circuit chip.

2 Claims, 3 Drawing Figures

GROUND CLIP FOR SEMI-CONDUCTOR PACKAGE

This invention relates to semi-conductor devices.

More particularly the invention relates to a protective clip for use in handling semi-conductor packages.

In a further aspect the present invention concerns a protective clip which is detachably engaged with a semi-conductor package to prevent shorting the integrated circuit during inadvertent contact with extraneous sources of electrical energy.

Semi-conductor devices are well known in the electronics art and are widely used to provide miniaturized circuitry which operates in response to extremely low voltage. Examples of effective use of semi-conductor devices includes calculators, radios and wrist watches. Briefly, the device includes a substrate which carries an integrated circuit chip which is electrically connected to a plurality of leads depending from the substrate.

The circuit of the semi-conductor package is extremely sensitive generally being designed to operate on less than 100 micro amps and in the range of 0.2 to 5 volts. It is immediately apparent, therefore, that the circuit is highly susceptible to damage when the leads are inadvertently brought into contact with any extraneous or stray source of electrical energy. The human body, for example, is capable of emitting electrical energy in the range of 24 volts.

To prevent shorting the integrated circuit during fabrication manufacturers of semi-conductor devices provide numerous preventative measures. Precautions are built into the device and extend to the environment in which the device is handled. For example, one specific type of semi-conductor device the metal oxide semi-conductor package commonly called an MOS has a plurality of spaced leads depending from either side thereof. Integrally fabricated with the leads on either side is a ground wire which by electrically interconnecting the leads maintains each of the leads at the same electrical potential. The semi-conductor package is handled by workers wearing a static free clothing and kept in rooms having atmospheric control conditions. Nevertheless even the most stringent safeguards have proven ineffective in preventing damage to the integrated circuit as demonstrated by the typical and accepted reject rate in the art.

The integrated circuit associated with the semi-conductor package is shorted for various reasons. Even if the ground wires are intact picking up an MOS package between two fingers such that one finger touches the leads on one side while the other finger touches the leads on the other side can induce sufficient current to destroy the integrated circuit. In other instances the device is destroyed during handling associated with testing since the only safety device the ground wire must be removed before the package is inserted into the electrical testing apparatus. The extremely vulnerable semi-conductor device having had the ground wires removed must still be packaged, shipped and handled by the ultimate consumer.

It would be highly advantageous therefore to provide a means of protecting semi-conductor packages.

Accordingly, it is an object of the present invention to provide a ground clip for protecting the integrated circuit of a semi-conductor package.

Another object of the present invention is to provide a ground clip which makes electrical contact with each of the several leads of a semi-conductor package for maintaining each lead at the same electrical potential.

Still another object of the present invention is to provide a ground clip which is readily and easily detachably secureable to a semi-conductor package.

Yet another object of the invention is the provision of a ground clip which can be engaged with the leads of a semi-conductor package before the integrated circuit chip is secured thereto.

Still a further object of the present invention is the provision of a ground clip of the above type which is effective yet sufficiently inexpensive to manufacture that it can be packaged with the semi-conductor device for protection during shipment and handling and discarded by the ultimate user.

Briefly, to achieve the desired objectives of the present invention in accordance with the preferred embodiment thereof provided is a ground clip having a cover portion with integrally formed skirt portions depending downwardly therefrom. The cover portion is sized and shaped to overlay the base of a semi-conductor package with the skirt portion enclosing at least the upper end of the contacts depending from the periphery of the base. The clip is formed of electrically conductive material with the skirt portions biased inwardly to concurrently frictionally engage the leads and to make electrical contact with each of the leads thereby maintaining all of the leads at the same electrical potential.

Optionally, the cover portion has an aperture therein which is dimensioned to expose the portion of the base member upon which the chip is carried. The aperture provides that the clip may be engaged with the semi-conductor device prior to the actual need for grounding the leads and provide protection throughout the manufacturing process. It is readily seen that the clip is readily removable after the semi-conductor device has been installed and electrically connected to the circuit to which is intended by the user.

The foregoing and further and more specific objects and advantages of the present invention will become readily apparent to those skilled in the art from the following detailed description thereof taken in conjunction with the drawings in which.

Figures 1, 2, 3:
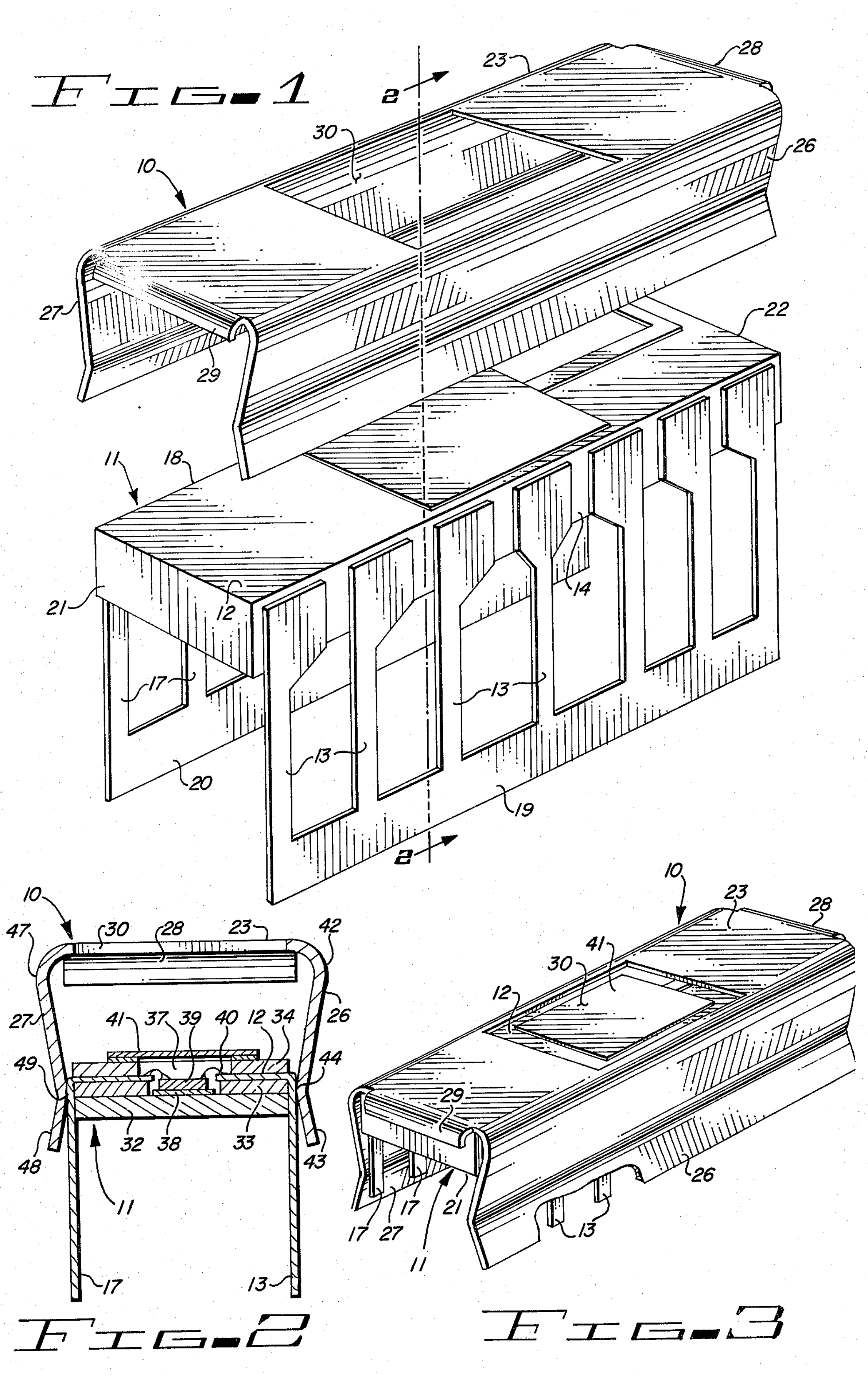
FIG. 1 is a composite illustration of a semi-conductor package and according to the present invention a ground clip for use therewith.
FIG. 2 is a vertical sectional view taken along the line 2—2 of FIG. 1 and further illustrating the semi-conductor device and the ground clip as it would appear when the clip is initially engaged with the semi-conductor device.
FIG. 3 is a perspective view of a semi-conductor device having the ground clip of the present invention detachably secured thereto.

Turning now to the drawings in which the same reference numeral indicates corresponding elements throughout the several views attention is first directed to FIG. 1 which shows a ground clip generally designated by the reference character 10 and constructed in accordance with the teachings of the present invention which is sized and shaped to be detachably engaged with a semi-conductor device herein specifically illustrated as a metallic oxide semi-conductor package (MOS package) generally designated by the reference character 11. The MOS package has a laminated substrate base 12 which carries the integrated circuit chip as will be hereinafter described in greater detail. A plurality of spaced leads 13 depend from a peripheral edge 14 of base 12 while a similar arrangements of leads 17 depend from the edge 18 of base 12. As will be described presently the leads 13 and 17 are in electrical contact with the integrated circuit chip. In accordance with one manufacturing technique as will be readily recognized by those skilled in the art the leads 13 and 17 are integrally formed as a lead frame which includes ground wires 19 and 20 integral with the lower end of leads 13 and 17 respectively. The ground wires maintain the respective leads at the same potential in an attempt to prevent shorting the integrated circuit. Base 12 is constructed of a non-conductor such as a ceramic material and has a first end 21 and a second end 22.

The ground clip 10 fabricated from electrically conductive material includes a cover portion 23 sized and shaped to overlay base 12. Skirts 26 and 27 depend downwardly along either edge of cover 23. Tabs 28 and 29 depend downwardly from either end of cover 23 to engage respectively over the ends 22 and 21 of base 12 to longitudinally retain the clip 10 upon the MOS package 11. Aperture 30 extending through cover 23 exposes the integrated circuit area of base 12 for manufacturing procedures associated therewith. Preferably clip 10 is integrally formed by conventional sheet metal stamping and forming processes of a thin material such as four thousands thick four hard stainless steel.

For a further understanding of the invention metal oxide semi-conductor package 11 is illustrated in greater detail in FIG. 2. Base 12 includes a foundation substrate 32 having an intermediate substrate 33 bonded thereto. The upper ends of leads 13 and 17 are directed inwardly and bonded between intermediate substrate 32 and top substrate 34. Aperture 37 extends through top substrate 34 and intermediate substrate 33 for the placement of dye pad 38 upon foundation substrate 32 and subsequently integrated circuit chip 39 upon dye pad 38 which are then bonded together. Each terminal of the integrated circuit carried upon chip 39 is electrically connected by soder 40 to an appropriate lead 13 or 17. As required by various applications cover 41 is secured to base 12 over aperture 37 to enclose integrated circuit chip 39.

Skirt portion 26 of clip 10 has an upper inwardly directed segment 42 and a lower outwardly directed segment 43 forming apex 44 therebetween. Similarly skirt portion 27 has an upper inwardly directed segment 47 a lower outwardly directed segment 48 forming apex 49 therebetween. Skirt portions 26 and 27 are biased inwardly or alternately formed such that the spacing between apexes 48 and 49 is slightly less than the measurement over the out side of legs 13 and 17. When clip 10 is pushed downwardly over MOS package 11 a slight interference fit is provided which insures that the clip will not become accidently dislodged. Electrical contact is made and maintained between skirt portion 26 and each lead 13 and between skirt portion 27 and each lead 17.

FIG. 3 illustrates semi-conductor package 11 having ground clip 10 engaged therewith. Ground wires 19 and 20 have been removed. For purposes of illustration leads 13 and 17 have been clipped to be shorter than skirt portions 26 and 27 to show that the ground clip 10 may be used to protect the leads from being accidently bent during shipment. Results in order that aperture 30 is of a sufficient size to expose aperture 37 and sufficient surrounding area of top substrate 34 to permit assembly of dye pad 38 chip 39 and cover 41 after the clip has been placed over the semi-conductor device. It will be appreciated that when in configuration as shown in FIG. 3 the MOS package may be handled without fear of electrical or mechanical damage thereto and after being soldered or otherwise secured within the circuit for which it is intended clip 10 is removed.

Various changes and modifications in the device herein chosen for purposes of illustration will readily occur to those skilled in the art. For purposes of illustration a metal oxide semi-conductor package was shown. It will therefore be appreciated that the exact size and shape of the ground clip of the present invention will vary in accordance with the particular semi-conductor package to be protected. The ground clip may also be fabricated without the aperture in the cover thereof and the skirt portions may assume various specific configurations which are functionally equivalent.

Having fully described and disclosed the present invention and the preferred embodiment thereof in such clear and concise terms as to enable those skilled in the art to understand and practice the same the invention claimed is:

1. A single-piece ground clip for use in combination with a semi-conductor package, said package including a base member and integrated circuit chip carried on said base member and a plurality of leads extending downwardly from the periphery of said base member, said leads connected electrically to respective components of said chip, said ground clip comprising:

a. a cover member formed of electrically conductive material sized to overlay said base member;

b. skirt members formed integrally with said cover member and depending downwardly therefrom adapted to make electrical contact with each of said plurality of leads to maintain each of said leads at the same potential while said clip is engaged with said package; and c. means for detachably securing said ground clip to said semi-conductor package such that the leads of said semi-conductor package can be electrically connected in the final intended circuit while said leads are still grounded by contact with said skirt members, said means comprising portions of said skirt members biased inwardly to make sliding frictional contact with said leads, allowing said leads to be exposed for connection in said final circuit and then allowing said ground clip to be detached from said semi-conductor package after said connection is effected.

2. The ground clip of claim 1 wherein said cover member further includes means defining an aperture therein dimensioned to expose at least the portion of the base member upon which said chip is carried.

* * * * *